United States Patent [19]

Larson

[11] Patent Number: 5,118,941
[45] Date of Patent: Jun. 2, 1992

[54] APPARATUS AND METHOD FOR LOCATING TARGET AREA FOR ELECTRON MICROANALYSIS

[75] Inventor: Paul E. Larson, Bloomington, Minn.

[73] Assignee: The Perkin-Elmer Corporation, Norwalk, Conn.

[21] Appl. No.: 690,870

[22] Filed: Apr. 23, 1991

[51] Int. Cl.$^5$ .......................................... H01J 37/256
[52] U.S. Cl. ..................... 250/310; 250/305; 250/306; 250/307
[58] Field of Search ............... 250/310, 305, 306, 307, 250/398, 492.3, 349

[56] References Cited

U.S. PATENT DOCUMENTS

| | | | |
|---|---|---|---|
| 3,766,381 | 10/1973 | Watson . | |
| 3,889,115 | 6/1975 | Tamura et al. | 250/307 |
| 4,041,311 | 8/1977 | Martin | 250/310 |
| 4,048,498 | 9/1977 | Berlach et al. . | |
| 4,219,731 | 8/1980 | Migitaka et al. | 250/310 |
| 4,560,872 | 12/1985 | Antonovsky | 250/310 |
| 4,894,541 | 1/1990 | Ono | 250/310 |

OTHER PUBLICATIONS

"How To Obtain Backscattered Electron Images" by D. P. Paul.
"Imaging With Backscattered Electrons In A Scanning Electron Microscope" by V.N.E. Robinson, Scanning 3, 15-26 (1980).
"Scanning Electron Microscopy" by O. C. Wells, A. Boyde, E. Lifshin and A. Rezanowich (McGraw-Hill, 1974).

Primary Examiner—Jack I. Berman
Assistant Examiner—Kiet T. Nguyen
Attorney, Agent, or Firm—H. S. Ingham; E. T. Grimes

[57] ABSTRACT

Target area on a specimen surface is located in an electron microanalyzer system that includes an electron energy analyzer and an analyzer detector. An electron gun impinges a rastering beam of incident electrons across the surface, a secondary electron detector provides corresponding signals for producing a scanning electron microscope image of the surface. Backscattered electrons effected from the incident electrons are passed through the analyzer for producing a further image that is superimposed on the SEM image to locate the target area to be subject to a separate microanalysis. Particularly for an electrically insulating specimen surface, the images are produced in a single frame of rastering, and surface area and beam current are sufficient to produce the images without substantial charge buildup.

21 Claims, 3 Drawing Sheets

1

APPARATUS AND METHOD FOR LOCATING TARGET AREA FOR ELECTRON MICROANALYSIS

This invention relates generally to electron microanalysis of surfaces, and particularly to determination of target area subject to electron microanalysis.

BACKGROUND OF THE INVENTION

A variety of electron microscopes and associated surface analyzers have evolved in recent years. A popular type is a scanning electron microscope (SEM) in which a focused electron beam is rastered over a sample surface. Secondary electrons emitted from the surface are detected in correlation with raster position. The secondary electron signals are processed electronically to provide a picture or image of topographical features of the surface. Such a microscope is described, for example, in a text "Scanning Electron Microscopy" by O. G. Wells, A Boyde, E. Lifshin and A. Rezanowich (McGraw-Hill, 1974). One common limitation of SEM is imaging the surface of insulators, because of rapid charge buildup from the incident beam of electrons. Conductive coatings or other techniques are used to alleviate this, but at the loss of surface details, time and cost of extra preparation, and loss of ability to remove surface layers during analysis.

Another method for analyzing surfaces utilizes secondary Auger electrons generated at the sample surface by a focused primary electron beam. Auger microprobes are suitable for detecting elements with atomic numbers equal to or greater than 3, and have sensitivity to only outermost atomic layers. Surface mapping of elements is accomplished by scanning with the primary electron beam. An example of a scanning Auger microprobe utilizing a cylindrical electrostatic electron analyzer is provided in U.S. Pat. No. 4,048,498.

Another approach to surface analysis is electron spectroscopy for chemical analysis (ESCA) which involves irradiating a sample surface with ultraviolet or preferably X-rays and detecting the characteristic photoelectrons emitted. The latter method is also known as X-ray photoelectron spectroscopy (XPS). The photoelectrons are filtered ("analyzed") by electrostatic or magnetic means which allow only electrons of a specified energy to pass through, similar to Auger analysis. The intensity of the resulting beam represents the concentration of a given chemical constituent of the sample surface. U.S. Pat. No. 3,766,381 describes such a system, including an electrostatic hemispherical type of analyzer. Such an analyzer also is used commonly for analysis of Auger electrons.

Elastically backscattered electrons (BSE) are also used for imaging, such as described in an article "Imaging with Backscattered Electrons in a Scanning Electron Microscope" by V.N.E. Robinson, *Scanning*, 15–26 (1980). These electrons are those electrons from an electron gun that are scattered by the surface with little or no energy loss. Images may be generated with special detectors as disclosed in the article. Another method is to use an energy analyzer for the BSE, as indicated in a technical reprint "How to Obtain Backscattered Electron Images" by D. P. Paul (undated), for use with Perkin-Elmer scanning Auger microprobes.

An optical microscope has generally been used to position specimens for ESCA analysis of a selected target area, or to determine area being analyzed. A simple microscope was adequate in the past, but advances in instruments have reduced the size of the analysis area, thus placing new demands on the microscope, including more magnification, shallower depth-of-field and greater stability. The microscope must be aligned to the center of the analysis area, a procedure that is inconvenient and subject to a variety of errors. The errors become more significant for smaller analysis areas, and alignment errors are not obvious during use of the system and, therefore, can lead to wrong analytical results. More magnification and shallower depth-of-field require that the objective lens for the microscope be larger in diameter and/or closer to the specimen, thereby using valuable solid angle about the specimen which could be used for other apparatus. Also, the analysis position can have a small dependence on kinetic energy, so the optical alignment can be exact only at one energy, resulting in an error at other energies. Adapting to these requirements results in a significantly more expensive optical microscope.

SUMMARY OF THE INVENTION

Therefore objects of the present invention are to provide a novel method and apparatus for locating a target area on a specimen surface in an electron microanalysis system, particularly an ESCA system. A further object is to locate such a target area with greater precision than optical methods. Another object is to locate such a target area with self-alignment for the selected electron energy of microanalysis. Other objects are to locate such a target area on an insulator surface, to provide a novel method for producing a scanning electron microscope image of an insulator surface, and to provide such an image without problems of charge buildup.

The foregoing and other objects are achieved with a method utilizing an electron microanalysis system that includes electron gun means for impinging a rastering beam of incident electrons across the surface to effect secondary electrons and target electrons from the surface, a secondary electron detector receptive of the secondary electrons for generating corresponding secondary electron signals, an electron energy analyzer receptive of the target electrons for passing electrons having a selected energy from the target area, an analyzer detector receptive of the passed electrons for generating corresponding analyzer signals, and processing means associated with the electron gun means and being receptive of each of the signals for producing respective images. The method comprises cooperatively operating the processing means and the electron gun means to produce a scanning electron microscope image of the surface, cooperatively operating the analyzer, the processing means and the electron gun means to produce a target image associated with the target area, and superimposing the target image on the scanning electron microscope image. The target image thereby represents location of the target area for microanalysis on the surface.

Preferably, the images are produced simultaneously, so that a single frame of rastering produces both images for self-alignment. Further, the energy of the incident electrons from the electron gun should be substantially equal to the selected analyzer pass energy for the microanalysis.

With an electrically insulating specimen surface, for determination of target area as well as more generally effecting an SEM image, current for the beam and area for the surface are selected cooperatively at sufficient levels to produce the images but insufficient to cause substantial charge buildup on the surface.

The objects are further achieved with an apparatus for locating a target area on a specimen surface in an electron microanalysis system. The system includes an electron energy analyzer receptive of electrons from a target area for passing electrons of selected energy, and an analyzer detector receptive of the passed electrons for generating corresponding analyzer signals useful for microanalysis of the target area. The apparatus comprises electron gun means for impinging a rastering beam of incident electrons across the surface, so as to effect target electrons from the surface for passing by the analyzer means and to further effect secondary electrons from the surface. The apparatus further comprises a secondary electron detector receptive of the secondary electrons for generating corresponding secondary electron signals, first processing means associated with the electron gun means and being receptive of the secondary electron signals so as to produce a scanning electron microscope image of the surface, second processing means associated with the electron gun means and being receptive of the analyzer signals so as to produce a target image associated with the target area, and third processing means for superimposing the target image on the scanning electron microscope image. The target image thereby represents location of the target area on the surface for microanalysis.

DETAILED DESCRIPTION OF THE INVENTION

Figure 1:
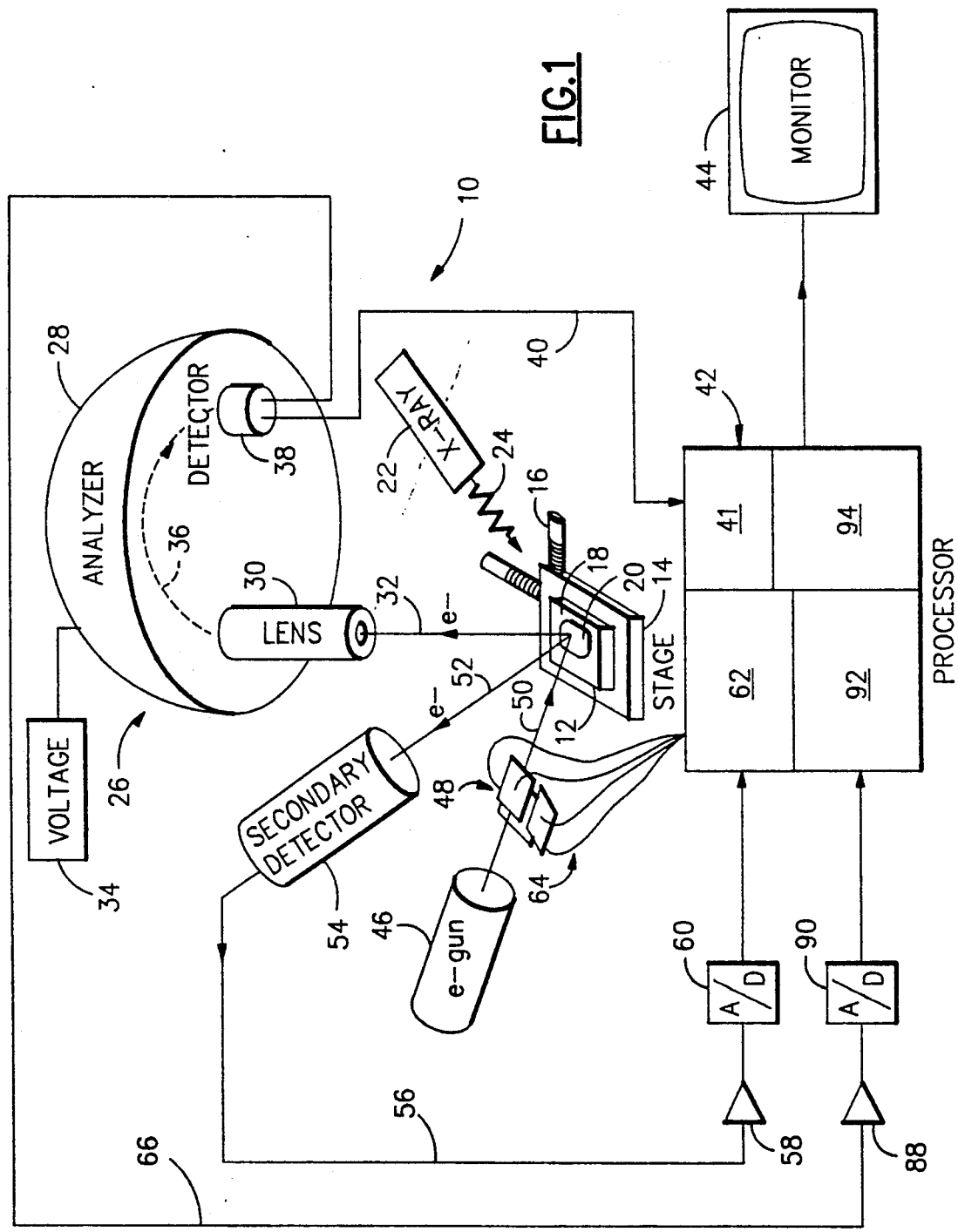
FIG. 1 is a schematic drawing of an analytical instrument incorporating the invention.

Although it will become apparent that any suitable system for electron surface microanalysis may incorporate the invention, a particularly suitable system 10 incorporating the invention is illustrated schematically in FIG. 1. This system is basically an ESCA system or conveniently a combination of ESCA and Auger. Thus many of the components may be conventional, for example as found in a PHI Model 5500 multi-technique microanalyses sold by The Perkin-Elmer Corporation. In such a system a specimen 12 rests on a stage 14 with micrometer positioners 16 for manual or motorized positioning. The specimen has a surface 18 with a target area 20 thereon to be analyzed. In the case of ESCA mode of operation, a source 22 of electromagnetic radiation such as ultraviolet light or X-rays 24 (for an XPS form of ESCA) is disposed to irradiate the surface. The irradiation causes photoelectrons to be emitted from the surface.

An electron energy analyzer means 26 includes an energy analyzer 28 such as a cylindrical type described in the aforementioned U.S. Pat. No. 4,048,498 or, as shown, a hemispherical type described in the aforementioned U.S. Pat. No. 3,766,381. The analyzing means also includes a conventional lens system 30, at least for the input to the analyzer. The lens collects target electrons 32 which in this case are photoelectrons emitted from the effective target area 20 and focusses them into the analyzer. With a selected voltage from a voltage source 34 applied to the analyzer, electrons of selected energy travel in a trajectory 36 so as to exit the analyzer for detection by a detector 38. The latter may be a conventional multichannel detector, for example having 16 channels for detecting a small range of electron energies passed by the analyzer in slightly different trajectories.

Signals from the detector 38 corresponding to intensity of electron input are directed on a line or lines 40 to an analyzing portion 41 of a processing unit 42 which combines control electronics and computer processing, such as with a Hewlett Packard Model 400 computer. In the conventional system the signals are processed typically to provide information on chemical species present at or near the surface of the specimen in the target area 20, and the information is displayed on a monitor 44 in the form of images, numbers and/or graphs. The actual target area analyzed is dependent on the electron lens 30 and generally also on the selected electron energy for the analyzer 28 via the applied voltage. A primary goal of the present invention is to determine the location of this target area.

An electron gun 46 is utilized for the present invention. This gun includes deflection plates 48 for rastering a focused electron beam 50 across the specimen surface 18. The electron gun may be provided specially for the present invention or, as in the example of the Model 5500, already may be present for a scanning electron microscope (SEM) mode of a multi-technique analyzer, and for an Auger analysis mode of operation of the instrument 10. In conventional operation of an Auger mode, the electron gun rasters a beam across the surface, and the analyzer means 26 with the detector 38 analyses Auger electrons for processing and display of chemical information for the target area 20.

The electron beam 50 effects secondary electrons 52 to be emitted from the surface. The secondary electrons generally are low energy, viz. 0 to 50 eV. The SEM aspect of the apparatus includes a conventional secondary electron detector 54 disposed near the specimen surface. A suitable type of detector is a Perkin-Elmer Model 04-202 detector. A corresponding signal from the detector is fed on a line 56 through an amplifier 58 to an analog-digital converter 60 and into an SEM portion 62 of the processor 42. This processor also controls voltages on the deflection plates 48 via lines 64, and cooperatively processes the signals to produce an SEM image on the monitor 44. This image is produced basically in the conventional manner for SEM mode of operation of such an instrument, except with modifications as set forth herein for the present invention.

The precise location of the target area 20 on the specimen surface 18 is determined by producing an SEM image of the surface, and superimposing on this image a second image, i.e. target image, produced by way of the analyzer means 26. Although the beam energy may be higher, preferably the beam 50 of the electron gun 46 has an electron energy that is substantially the same as the electron energy intended for photoelectron ESCA analysis. In this case electrons 32 from the target being analyzed for target location are elastically backscattered ("BSE") without energy loss, thus having the same energy as the incident electrons 50. Such a mode allows for a strong BSE signal. Selecting incident electrons and associated BSE with the same energy as for the intended ESCA analysis allows for self alignment. No further calibration is needed in a system in which the target area depends on the electron energy. If ESCA analysis is to be made at several energies, it may be desirable to redetermine the location of the target area for each energy.

Figure 2:
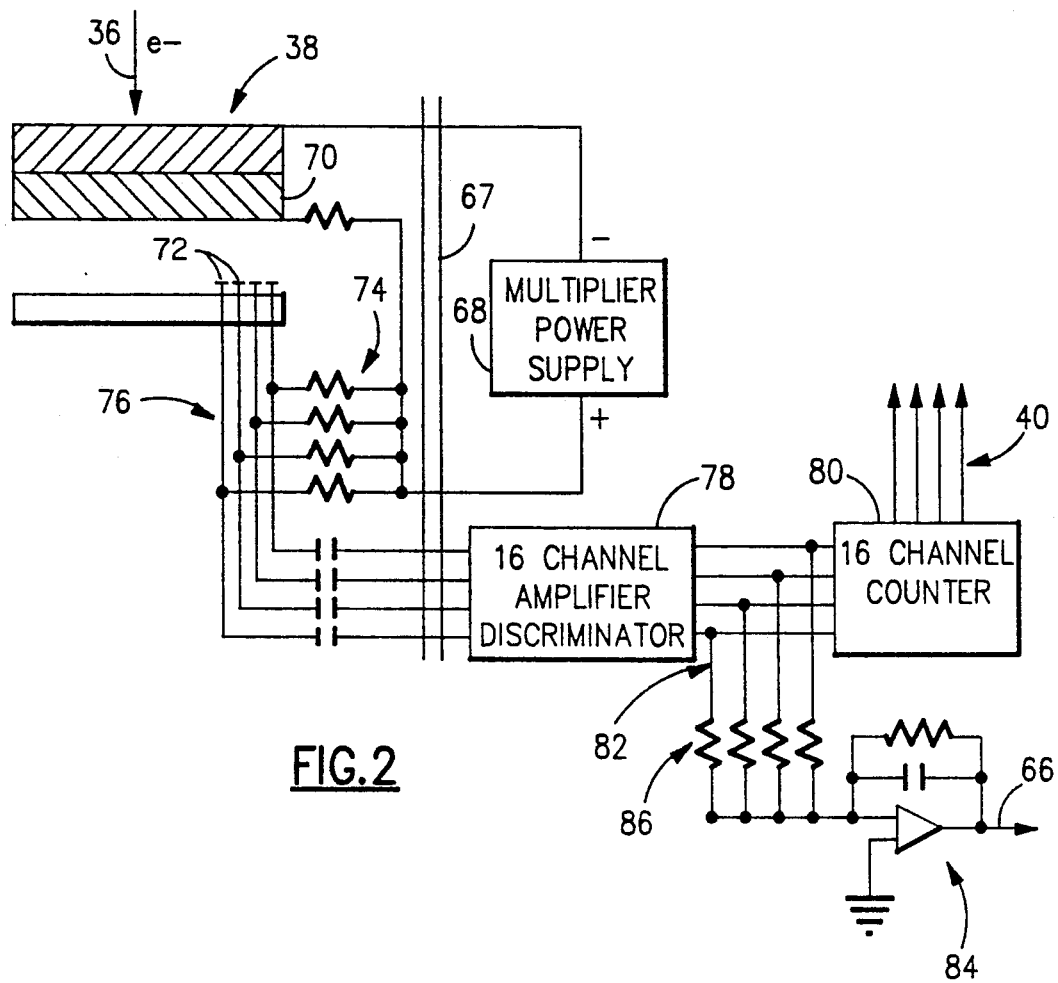
FIG. 2 is a schematic drawing showing electrical connections for an analyzer detector portion of the instrument of FIG. 1.

The BSE signal is tapped from the analyzer detector 38 via line 66. FIG. 2 shows how this may be done. In the conventional section of the instrument a chevron channel plate multiplier detector 38 is located inside the vacuum chamber 67 to receive electrons 36 emerging from the analyzer. A power supply 68 applies voltage between the multiplier 70 and the detector plate strips 72 via resistors 74. The detector signals on the 16 channel lines 76 (four shown) are brought outside the chamber walls 67 to an amplifier and discriminator 78, and thence to a 16 channel counter 80 and lines 40 to the processor (FIG. 1) for the ESCA or Auger analysis.

For production of the target image it is not necessary to obtain separate signals from the multiple channels of the detector 38. Therefore, signals from these channels are tapped with lines 82 after the amplifier 78, summed through resistors 86 and integrated in a circuit 84 to output line 66. This output 66 feeds through a further amplifier 88 (FIG. 1) and an analog-digital converter 90 and thence to a further portion 92 of the processor for producing the second image. Cooperation with the deflector drive in processor 62 for the electron gun plates 48 allows coordinated processing to produce a target image in the same manner as for producing the SEM image. This image is a representation of backscattered electrons over the target area.

Figure 3:
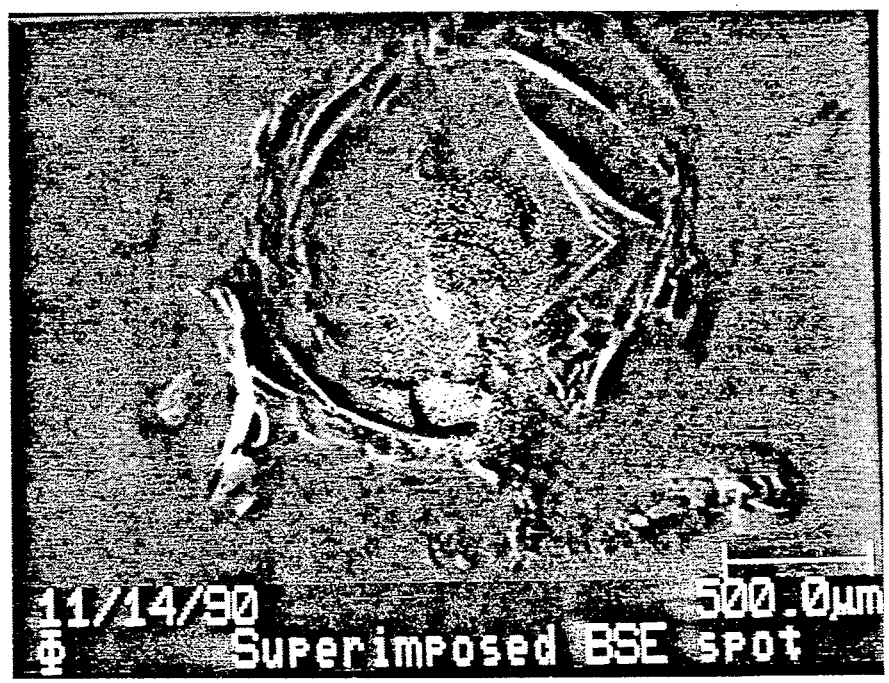
FIG. 3 is a photograph of a scanning electron microscope image of a surface with a backscattered electron image superimposed thereon to show target area according to the invention.

Signals representing the two images are sent to a combining portion 94 of the processor for superimposing. The superimposed images are then displayed on the monitor and photographed as shown in FIG. 3 for a scratched glass surface. The overall image is an SEM picture 96 of the specimen surface (or some selected portion of the entire surface). The image representing the target area may be seen as a pattern of light dots 98 or light area in the SEM picture 96. The pattern may vary in intensity across the target area, but this variation generally is ignored in the present invention, because the purpose is merely to delineate or locate the target area. Advantageously the data is further processed in the processor 94 to produce the target image as a representive line pattern on the SEM image, such as an ellipse or other perimetric line showing the size and shape of target area, or cross bars 102 showing the center location, or a combination of both.

For clarity the several portions of the processor 42 are shown separately in FIG. 1. However such portions actually may include a commonality of components and various sections of a computer program. Any computer programs mentioned or implied herein are readily prepared in a conventional language such as "C" generally available from the supplier of the computer used.

Figure 4:
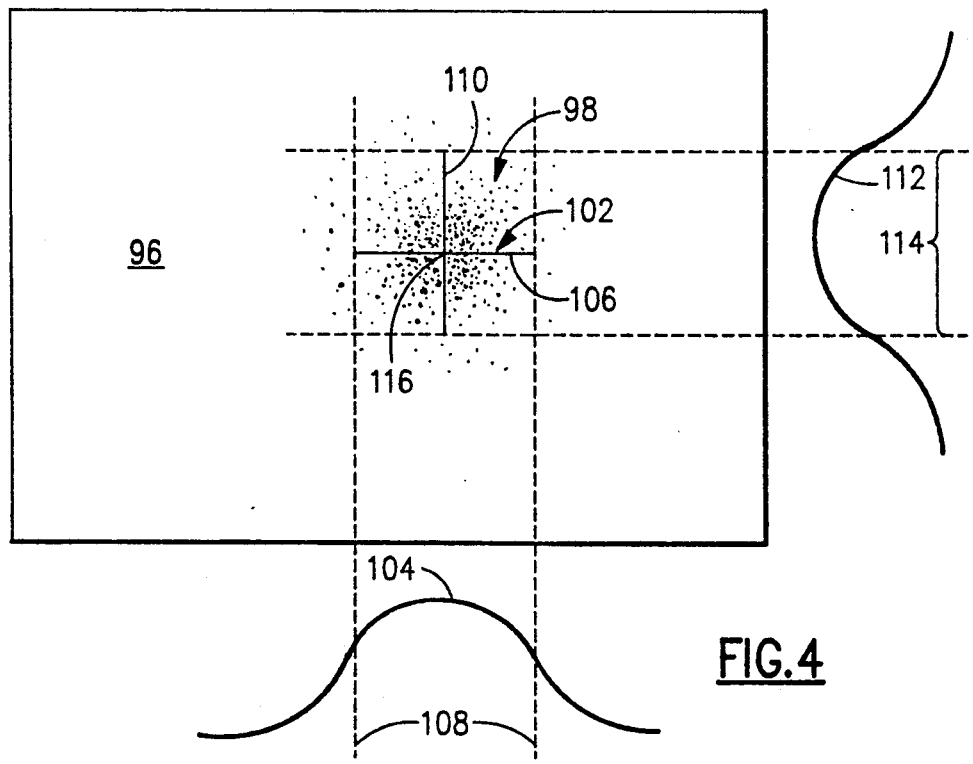
FIG. 4 is drawing of a scanning electron microscope image of a surface with a backscattered electron image superimposed thereon, and histograms of the backscattered electron image as used for generating cross lines representing the target area.

With further reference to FIG. 4 which is a simplified drawing of superimposed images, logic for generating cross lines in the processor is as follows: The initial SEM and BSE images are acquired separately with 8 bits of grey scale information per pixel. The BSE pixel signal strengths for each vertical column are added and a histogram 104 for the horizontal is computed. A horizontal bar 106 is drawn between the half maxima 108 on either side of the histogram. A vertical bar 110 is drawn similarly via a histogram 112 with half maxima 114. The two bars are made to intersect at their centers 116. The cross bars 102 representing target image are then superimposed conventionally on the SEM image 96.

A single raster frame with the electron gun is all that is needed for each of the images. The SEM and analyzer images may be acquired sequentially with data storage and processing for superimposition and display. Preferably, however, a single frame rastered with a single electron gun is utilized for producing both images, with simultaneous collection of signals and data processing into the double image. Superimposition is effected in the data processing simply by adding data representing respective signal strengths of the SEM and target images for each pixel in the raster pattern.

X- and Y- scales (not shown) also may be superimposed. During typical operation an initial location of the target area may be noted and, if a different location is desired, the scale tells how much to move the stage micrometers 16. Another double image then may be generated optionally to check the new location. Thus, to minimize time as well as surface damage, it is not necessary for the double image to be generated continuously. However, it may be desirable to automate positioning with motorized micrometers and keyboard entry of new relative location, with automatic generation of images after each relocation.

As indicated, the invention is particularly useful with an ESCA system, but more generally will apply to other systems in which the specimen surface is flooded by a large-area exitation source such as photons, ions, electrons and fast neutral atoms. In such circumstances the analysis or target area is determined by the lens between the target and the analyzer. In the case of the present example the target area is 70 microns. However, in conventional Auger analysis the target area is much smaller than the analyzer field of view. The analyzer lens is operated in a large area mode, e.g. 800 microns so that the electron beam is always within the field-of-view. In this case the SEM image itself is sufficient to show the target area. However, an Auger system could be operated in the small area mode with large area electron beam exitation, in which case the present invention may be utilized.

The present method and system are suitable even with insulating target materials such as oxides, for which conventional SEM is problematical because of charge buildup on the target. Insulators are frequently used as targets for ESCA. Preferably the insulator surface is first electrically discharged by a brief exposure to radiation, making use of the ESCA source 22 if available, for example with aluminum or magnesium K-alpha X-ray. The amount of exposure required should be very small, generally less than about one percent, e.g. about 0.1%, of the dose selected for the ESCA analysis, so that surface damage is insignificant.

Particularly for insulators, the images should be effected with only one frame of rastering of the electron gun. Beam energy should be low, e.g. 1 kV, consistent with an energy similar to ESCA electron energy. Specimen surface area should be relatively large (by ordinary SEM standards), e.g. 4 $mm^2$, and beam current should be low, e.g. 0.2 nA. More broadly, the surface area and current should be selected cooperatively so that less than about one surface atom in 1000 and more than about one in 10,000, e.g. one in 5000, is struck by an incident electron in each frame of rastering. Surface charge buildup should be insubstantial, and yet there should be sufficient dosage for imaging. This method is more generally useful for providing SEM images per se of an insulator surface, as distinct from including the second imaging of a target area. If a succession of images is desired, the steps of operating and irradiating should be repeated alternately so as to produce successive SEM images of the specimen surface without charge buildup.

While the invention has been described above in detail with reference to specific embodiments, various changes and modifications which fall within the spirit of the invention and scope of the appended claims will become apparent to those skilled in this art. The invention is therefore only intended to be limited by the appended claims or their equivalents.

What is claimed is:

1. A method of locating a target area on a specimen surface larger than the target area, in an electron microanalysis system including electron gun means for impinging a rastering beam of incident electrons across the surface to effect secondary electrons and target electrons from the surface, secondary electron detector means receptive of the secondary electrons for generating corresponding secondary electron signals, electron energy analyzer means receptive of the target electrons for passing electrons having a selected energy from the target area, analyzer detector means receptive of the passed electrons for generating corresponding analyzer signals, and processing means associated with the electron gun means and being receptive of each of the signals for producing respective images, the method comprising cooperatively operating the processing means and the electron gun means to produce a scanning electron microscope image of the surface, cooperatively operating the analyzer means, the processing means and the electron gun means to produce a target image associated with the target area, and superimposing the target image on the scanning electron microscope image, whereby the target image represents location of the target area on the surface, the method further comprising separately performing a microanalysis of the target area by operating the microanalysis system with the analyzer means passing electrons at the selected energy and without simultaneously operating the processing means to superimpose a scanning electron image.

2. The method of claim 1 wherein the electron gun means is operated to effect the incident electrons at a predetermined energy substantially equal to the selected energy such that the passed electrons are elastically backscattered electrons.

3. The method of claim 1, wherein the system further includes an electromagnetic radiation source disposed to irradiate the target area so as to effect photoelectrons therefrom, and the step of operating the system comprises operating the radiation source so that photoelectrons are emitted from the target area substantially at the selected energy, whereby the analyzer means are receptive of the photoelectrons at the selected energy for the microanalysis of the target area.

4. The apparatus of claim 3 wherein the radiation source is an X-ray source.

5. The method of claim 1 wherein the steps of operating are effected coincidentally such that the images are produced simultaneously.

6. The method of claim 5 wherein the steps of operating are further effected so that a single frame of rastering of the electron gun produces both images.

7. The method of claim 6 wherein the specimen surface is electrically insulating, and the method further comprises cooperatively selecting current for the beam and area of the surface sufficient to produce the images and insufficient to cause substantial charge buildup on the specimen surface.

8. The method of claim 7 wherein the step of cooperatively selecting is such that one atom in about 1000 to 10,000 surface atoms is struck by an incident electron in the single frame of rastering.

9. The method of claim 7 wherein the system further includes an electromagnetic radiation source disposed to irradiate the specimen surface with a selected dose for effecting photoelectrons from the target area for microanalysis, and the method further comprises initially irradiating the specimen surface with a dosage less than about one percent of the selected dose so as to initially discharge the specimen surface electrically.

10. The method of claim 1 wherein the target image is produced by the processing means in the form of a representative line pattern.

11. Apparatus for locating a target area on a specimen surface larger than the target area, in an electron microanalysis system including electron energy analyzer means receptive of electrons from a target area for passing electrons of selected energy, and analyzer detector means receptive of the passed electrons for generating corresponding analyzer signals useful for microanalysis of the target area, the apparatus comprising electron gun means for impinging a rastering beam of incident electrons across the surface so as to effect target electrons from the surface for passing by the analyzer means and to further effect secondary electrons from the surface, secondary electron detector means receptive of the secondary electrons for generating corresponding secondary electron signals, first processing means associated with the electron gun means and being receptive of the secondary electron signals so as to produce a scanning electron microscope image of the surface, second processing means associated with the electron gun means and being receptive of the analyzer signals so as to produce a target image associated with the target area, and third processing means for superimposing the target image on the scanning electron microscope image, whereby the target image represents location of the target area within the specimen surface for microanalysis by the analyzer means, the apparatus further comprising means for separately performing a microanalysis of the target area by operating the microanalysis system with the analyzer means passing electrons at the selected energy and without simultaneously operating the processing means to superimpose a scanning electron image.

12. The apparatus of claim 11 wherein the system further includes an electromagnetic radiation source disposed to irradiate the target area so as to effect photoelectrons therefrom substantially at the selected energy, whereby the analyzer means is receptive of the photoelectrons at the selected energy for the microanalysis of the target area.

13. The apparatus of claim 12 wherein the radiation source is an X-ray source.

14. The apparatus of claim 11 wherein the electron gun means effects the incident electrons at a predetermined energy substantially equal to the selected energy such that the passed electrons are elastically backscattered electrons.

15. The apparatus of claim 11 wherein the first, second and third processing means are cooperatively associated such that the images are produced simultaneously.

16. The apparatus of claim 15 wherein the first and second processing means produce both images with a single frame of rastering of the electron gun.

17. The apparatus of claim 11 further comprising means for producing the target image in the form of a representative line pattern.

18. A method of producing a scanning electron microscope image of an electrically insulating specimen surface with an electron microanalysis system including electron gun means for impinging a rastering beam of incident electrons across the surface to effect secondary electrons from the surface, secondary electron detector means receptive of the secondary electrons for generating corresponding signals, and processing means associated with the electron gun means and being receptive of the signals for producing a scanning electron microscope image, the method comprising cooperatively selecting current for the beam and area of the surface sufficient to produce the images and insufficient to cause substantial charge buildup on the specimen surface in a single frame of rastering, and cooperatively operating the processing means and the electron gun means in a single frame of rastering so as to produce the image of the surface based on the single frame.

19. The method of claim 18 wherein the step of cooperatively selecting is such that one surface atom in about 1000 to 10,000 surface atoms is struck by an incident electron in the single frame of rastering.

20. The method of claim 18 wherein the system further includes an electromagnetic radiation source disposed to irradiate the specimen surface, and the method further comprises, prior to the step of operating, irradiating the specimen surface with a selected dosage sufficient to electrically discharge the specimen surface and insufficient to significantly damage the specimen surface.

21. The method of claim 20 further comprising alternately repeating the steps of operating and irradiating so as to produce successive images of the specimen surface.

* * * * *

UNITED STATES PATENT AND TRADEMARK OFFICE
CERTIFICATE OF CORRECTION

PATENT NO. : 5,118,941
DATED     : June 2, 1992
INVENTOR(S) : Paul E. Larson

It is certified that error appears in the above-identified patent and that said Letters Patent is hereby corrected as shown below:

Column 1, line 57, after "Scanning" delete "," and insert --3,--

Signed and Sealed this

Thirty-first Day of August, 1993

Attest:

BRUCE LEHMAN

Attesting Officer    Commissioner of Patents and Trademarks